(12) United States Patent
Akiyama

(10) Patent No.: US 7,701,004 B2
(45) Date of Patent: Apr. 20, 2010

(54) SEMICONDUCTOR DEVICE AND METHOD OF MANUFACTURING THEREOF

(75) Inventor: Kazutaka Akiyama, Matsudo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 12/010,935

(22) Filed: Jan. 31, 2008

(65) Prior Publication Data

US 2008/0211030 A1 Sep. 4, 2008

Related U.S. Application Data

(63) Continuation of application No. 11/435,808, filed on May 18, 2006, now abandoned.

(30) Foreign Application Priority Data

Jul. 15, 2005 (JP) .............................. 2005-206370

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................... 257/334; 257/337; 257/369; 257/E27.06; 257/E27.062

(58) Field of Classification Search .................. 257/334, 257/337, 338, 351, 368–369, E27.062, E27.06
See application file for complete search history.

(56) References Cited

U.S. PATENT DOCUMENTS

| 6,897,503 | B2 | 5/2005 | Otani et al. | |
| 2002/0187567 | A1 | 12/2002 | Yamazaki et al. | |
| 2005/0090055 | A1* | 4/2005 | Lee et al. | 438/256 |

FOREIGN PATENT DOCUMENTS

| JP | 2000-114372 | 4/2000 |
| JP | 2002-184860 | 6/2002 |

* cited by examiner

*Primary Examiner*—Hoai v Pham
(74) *Attorney, Agent, or Firm*—Finnegan, Henderson, Farabow, Garrett & Dunner, L.L.P.

(57) ABSTRACT

A first conductive layer and a second conductive layer are formed on an upper surface of a semiconductor substrate. The second conductive layer formed at a higher location than the first conductive layer. An insulating film is formed over the semiconductor substrate to cover the first conductive layer and the second conductive layer. An interlayer insulator has a structure of at least two layers including a first layered film composed of an organic insulating material and a second layered film composed of an inorganic insulating material and formed on the first layered film. The interlayer insulator is formed covering the first conductive layer and the second conductive layer.

6 Claims, 8 Drawing Sheets

SEMICONDUCTOR DEVICE AND METHOD OF MANUFACTURING THEREOF

CROSS-REFERENCE TO RELATED APPLICATION

This is a continuation of application Ser. No. 11/435,808, filed May 18, 2006 now abandoned, which is incorporated herein by reference.

This application is based upon and claims the benefit of priority from prior Japanese Patent Application No. 2005-206370, filed on Jul. 15, 2005, the entire contents of which are incorporated herein by reference.

BACKGROUND OF THE INVENTION

1. Field of the Invention

The present invention relates to a semiconductor device and method of manufacturing the same.

2. Description of the Related Art

A process of manufacturing a semiconductor device comprises a step of forming plural conductive layers on a semiconductor substrate and a step of forming contact holes reaching respective conductive layers for connection of wires to the conductive layers (see JP-A 2002-184860). For example, when a MOSFET is formed on the semiconductor substrate, source/drain-diffused regions are formed in the semiconductor substrate, and a gate electrode is formed on the semiconductor substrate with a gate insulator sandwiched therebetween. Subsequently, an interlayer insulator is formed covering these diffused regions and the gate electrode. Then, a resist pattern formed on the interlayer insulator is employed as a mask to carry out a process of RIE (Reactive Ion Etching) to form contact holes through: the interlayer insulator. A wire material is buried in the contact holes to form contacts for wiring.

In this case, the contact hole reaching the gate electrode has a different depth from that of the contact holes reaching the diffused regions located deeper than the gate electrode. Therefore, when these contact holes are formed at the same time, the contact hole for the gate electrode located shallower is opened first. As a result, the gate electrode suffers damage from RIE until the contact holes reaching the source/drain-diffused regions are opened. At that time, attachment of foreign substrates to the surface of the gate electrode wire on the bottom of the contact hole tends to result in a contact interface with a high electrical resistance. When the width of the bottom of the contact hole is broadened to form a reverse-tapered hole, a void (cavity) may be formed in the wire material buried later in the contact hole, causing a connection failure in the contact hole possibly.

SUMMARY OF THE INVENTION

In one aspect the present invention provides a semiconductor device, comprising: a semiconductor substrate having an upper surface with a first conductive layer and a second conductive layer formed thereon, the second conductive layer formed at a higher location than the first conductive layer; an insulating film formed over the semiconductor substrate to cover the first conductive layer and the second conductive layer; and an interlayer insulator having a structure of at least two layers including a first layered film composed of an organic insulating material and a second layered film composed of an inorganic insulating material and formed on the first layered film, the interlayer insulator formed on the insulating film to cover the first conductive layer and the second conductive layer.

In one aspect the present invention provides a method of manufacturing a semiconductor device, comprising: forming a first conductive layer and a second conductive layer located higher than the first conductive layer on an upper surface of a semiconductor substrate; forming an insulating film over the semiconductor substrate including the first conductive layer and the second conductive layer; forming an interlayer insulator having a structure of at least two layers including a first layered film composed of an organic insulating material and a second layered film composed of an inorganic insulating material and formed on the first layered film, the interlayer insulator formed via the insulating film to cover the first conductive layer and the second conductive layer; and etching the second layered film under a first etching condition and etching the first layered film under a different etching condition from the first etching condition to form contact holes on the second conductive layer and the first conductive layer.

DETAILED DESCRIPTION OF THE INVENTION

Embodiments of the present invention will now be described with reference to the drawings.

First Embodiment

Figure 1:
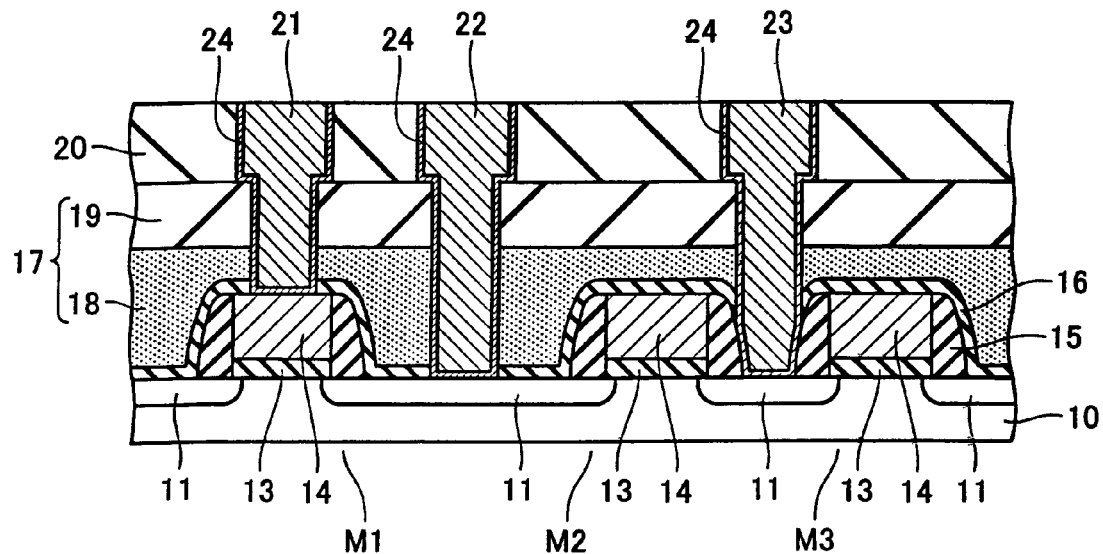
FIG. 1 is a cross-sectional view showing a structure of a semiconductor device according to a first embodiment of the present invention.

FIG. 1 shows a cross-sectional view of a semiconductor device according to a first embodiment of the present invention. The semiconductor device comprises a plurality of MOS transistors formed in a semiconductor substrate 10. FIG. 1 shows three n-type MOS transistors M1, M2 and M3, which share drain/source-diffused regions 11 (first conductive layer) formed in the upper surface of the semiconductor substrate 10. It is assumed herein in relation to the pattern layout that the interval between the MOS transistors M2 and M3 is determined narrower than that between the MOS transistors M1 and M2. In addition, the gate electrode and others of the MOS transistors M2, M3 are wired at a minimal wiring interval.

Each of the MOS transistors comprises a gate insulator 13 composed, for example, of silicon oxide and formed on the semiconductor substrate 10 between the source/drain-diffused regions 11, and a gate electrode 14 (second conductive layer) composed, for example, of polysilicon and formed on the gate insulator 13. A sidewall insulating film 15 composed, for example, of silicon oxide is formed on sides of the gate electrode 14. A silicon nitride film 16 is formed over the semiconductor substrate 10 including the upper surface of the gate electrode 14.

An interlayer insulator 17 is formed over the silicon nitride film 16. The interlayer insulator 17 has a double-layered structure with a first layered film 18 composed of an organic insulating material in a lower layer and a second layered film 19 composed of an inorganic insulating material in an upper layer. The organic insulating material of the first layered film 18 is, for example, a polyallylene-based organic film, more specifically SiLK (trade name) available from Dow Chemical Company or FLARE (trade name) available from Honeywell Inc. The second layered film 19 may be composed of TEOS (tetraethoxysilane). In this embodiment, the first layered film 18 is deposited up to a height higher than the uppermost portion of the silicon nitride film 16 or the silicon nitride film 16 on the gate electrode 14. Further, an interlayer insulator 20 composed, for example, of silicon oxide is formed over the second layered film 19.

In contact holes formed through the interlayer insulators 17 and 20, contacts 21, 22 and 23 are formed via a barrier metal film 24. The contact 21 is formed reaching the upper surface of the gate electrode 14 of the transistor M1. The contact 22 is formed reaching the source/drain-diffused region 11 shared between the transistors M1 and M2. The contact 23 is formed reaching the source/drain-diffused region 11 formed at the minimal wiring interval and shared between the transistors M2 and M3.

In this embodiment the interlayer insulator 17 has the double-layered structure with the first layered film 18 composed of an organic insulating material and the second layered film 19 composed of an inorganic insulating material as described above. This structure avoids problems, such as an increase in resistance due to deposition of foreign substrates and an occurrence of void due to over etching, at the time of simultaneous formation of the contact holes for formation of the contacts 21-23. This point is described below with reference to FIGS. 2-7 together with process steps of the semiconductor device.

Figure 2:
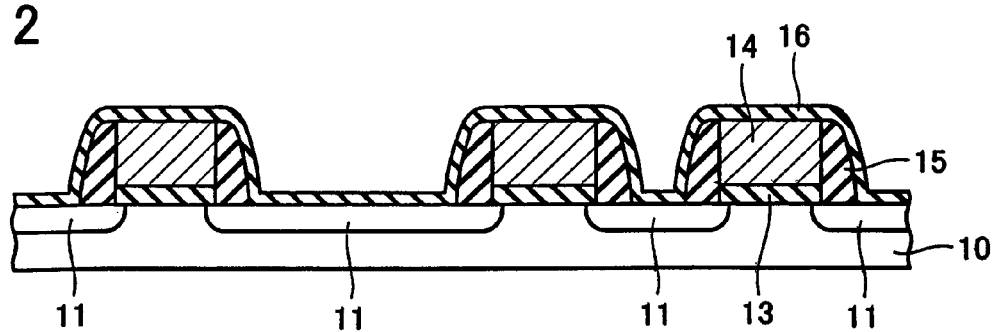
FIG. 2 shows a process step of the semiconductor device of the first embodiment.

First, as shown in FIG. 2, known process steps of MOS transistors are applied to form the source/drain-diffused regions 11, for example, at a minimal line/space width of 90/90 nm. In addition, the gate insulator 13 with a thickness of about 50 nm and the gate electrode 14 with a thickness of about 200 nm are formed, for example, at a minimal line/space width of 50/120 nm. Thereafter, the sidewall insulating film 15 with a thickness of about 30 nm and the silicon nitride film 16 with a thickness of about 50 nm are formed using a known process of CVD or RIE.

Figure 3:
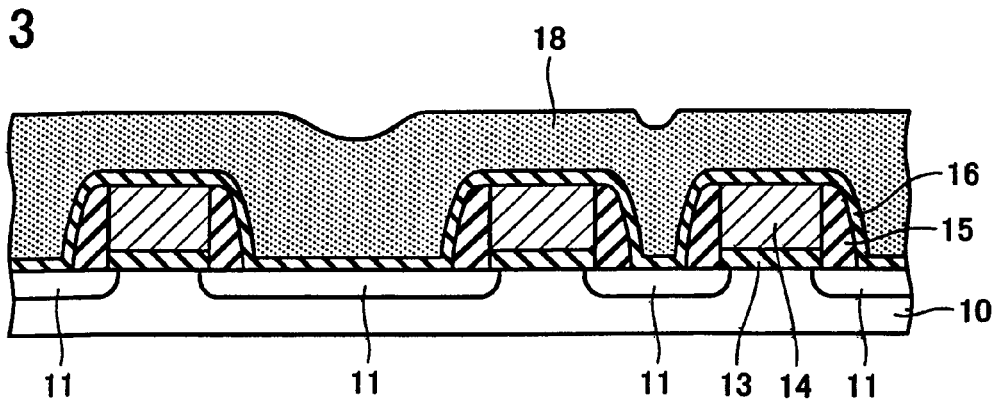
FIG. 3 shows a process step of the semiconductor device of the first embodiment.
Figure 4:
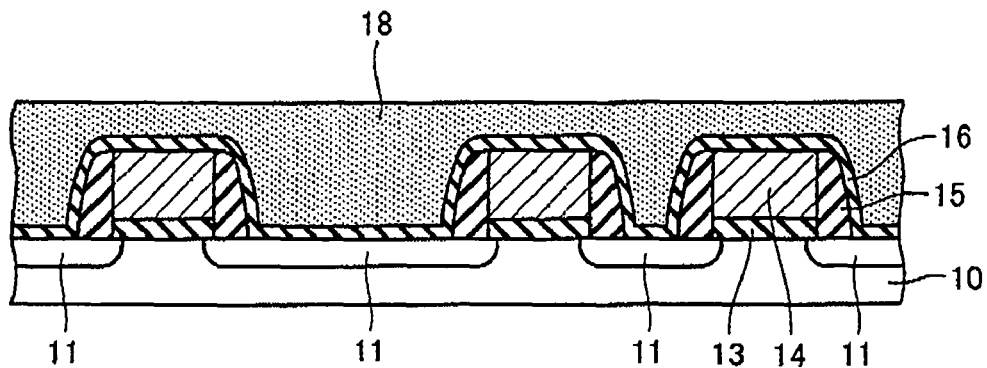
FIG. 4 shows a process step of the semiconductor device of the first embodiment.
Figure 5:
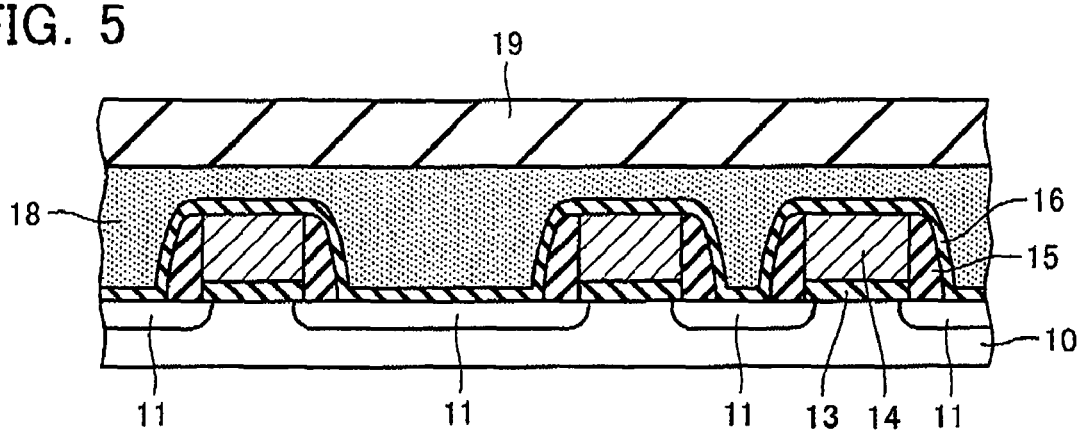
FIG. 5 shows a process step of the semiconductor device of the first embodiment.

Subsequently, as shown in FIG. 3, SiLK (trade name) available from Dow Chemical Company is coated with a thickness of about 600 nm using a spin coating method to form the first layered film 18 covering the gate electrode 14 and others. After thermal curing of SiLK, a slurry mainly including an organic material such a resin is employed in a process of CMP (Chemical Mechanical Polishing) to polish the first layered film 18 for planarization to a thickness of about 400 nm as shown in FIG. 4. Then, a TEOS film with a thickness of about 100 nm is deposited by CDV or the like over the planarized first layered film 18 to form the second layered film 19 as shown in FIG. 5.

Figure 6:
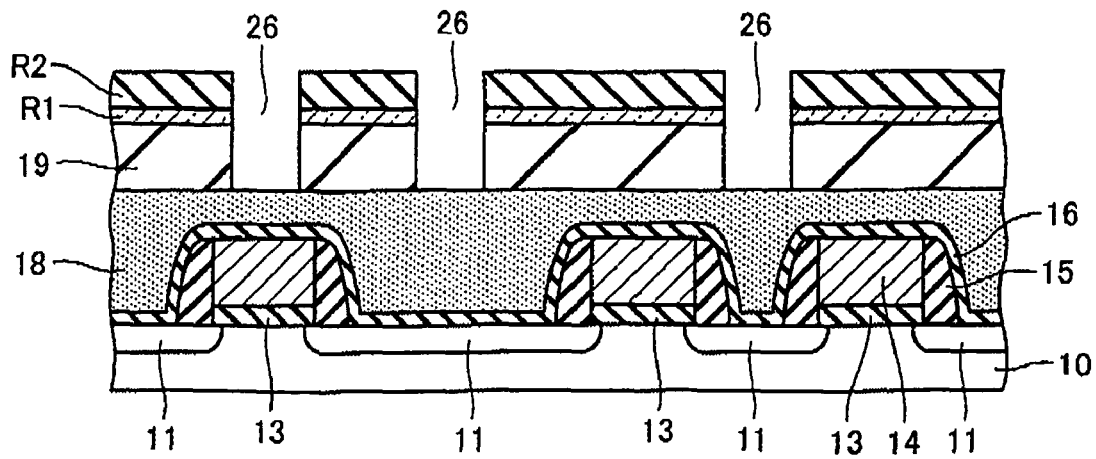
FIG. 6 shows a process step of the semiconductor device of the first embodiment.

Then, an antireflective film R1 with a thickness of about 60 nm and a resist film with a thickness of about 150 nm are formed on the second layered film 19 by photolithography as shown in FIG. 6. These films are employed as a mask to form contact holes 26 through the second layered film 19 by RIE using a C4F8 gas. When the C4F8 gas is used, a selective ratio of the TEOS film to SiLK (trade name) is 50 or more. Therefore, etching is only effective to the second layered film 19 composed of TEOS and stops at the interface between the first layered film 18 and the second layered film 19. After completion of processing the contact holes 26, the resist R2 is expected to have a thickness of about 100 nm.

Figure 7:
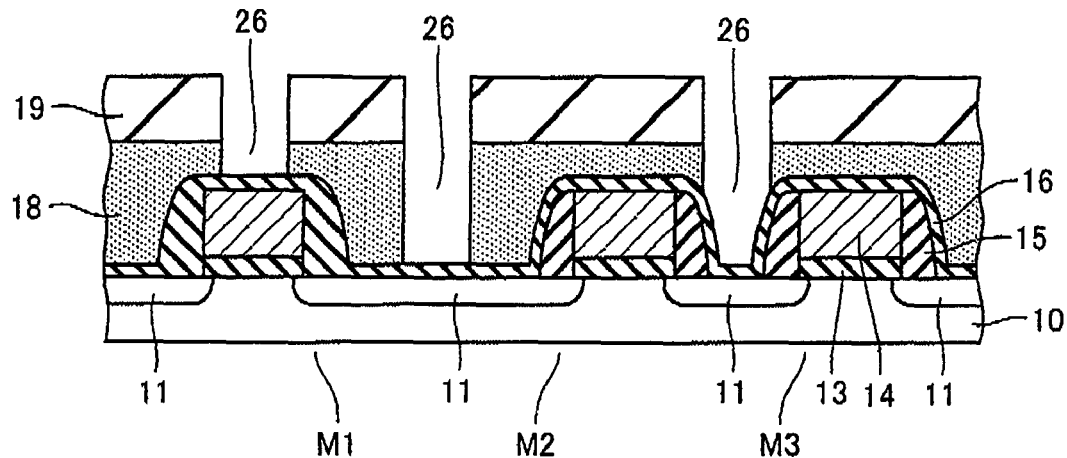
FIG. 7 shows a process step of the semiconductor device of the first embodiment.

After the etching gas is switched to an ammonia (NH3) gas, the second layered film 19 is employed as a mask to etch the first layered film 18 by RIE to form the contact holes 26 further deeper as shown in FIG. 7. When the NH3 gas is used, the selective ratio of silicon nitride to SiLK (trade name) is large. Accordingly, the silicon nitride film 16 is hardly processed and only the first layered film 18 can be etched. The contact hole 26 between the transistors M2 and M3 formed at the minimal wiring interval is formed along the shape of the silicon nitride film 16. The etching with the NH3 gas completely removes the antireflective film R1 and the resist R2 left on the second layered film 19. In addition, the NH3 gas hardly etches the TEOS film. Accordingly, the contact holes 26 formed through the second layered film 19 can be prevented from varying the shapes thereof. Thus, the interlayer insulator 17 having the double-layered structure with such the first layered film 18 and the second layered film 19 is possible to make the second layered film 19 serve as a hard mask having a higher selective ratio on etching the first layered film 18.

Finally, the etching gas is switched to a CF4 gas to etch the silicon nitride film 16 such that the contact holes 26 penetrates to the source/drain-diffused region 11 and the gate electrode 14.

Subsequently, a process of ALD (Atomic Layer Deposition) or CVD (Chemical Vapor Deposition) is employed to form the barrier metal film 24 composed, for example, of TiSiN on the wall in the contact holes 26. Further, CVD is employed to bury tungsten (W) in the contact holes 26 and then CMP is applied to remove tungsten deposited outside the contact holes 26.

In addition, a TEOS film with a thickness of about 100 nm is deposited on the second layered film 19 to form the interlayer insulator 20. Further, the contact holes reaching the contacts 21-23 are formed through the interlayer insulator 20. Then, spattering is applied to form a tantalum (Ta) film and a copper (Cu) film as the barrier metal film 24 on the wall in the contact holes, followed by plating copper (Cu). Finally, Ta and Cu outside the contact holes are removed by CMP to complete the semiconductor device as shown in FIG. 1.

In this embodiment, the lower layered film or the first layered film 18 of the interlayer insulator 17 is composed of an organic insulating material having a large selective ratio to the silicon nitride film 16. Therefore, the contact holes 26 can be processed without damaging the silicon nitride film 16 and accordingly the gate electrode 14.

Second Embodiment

Figure 8:
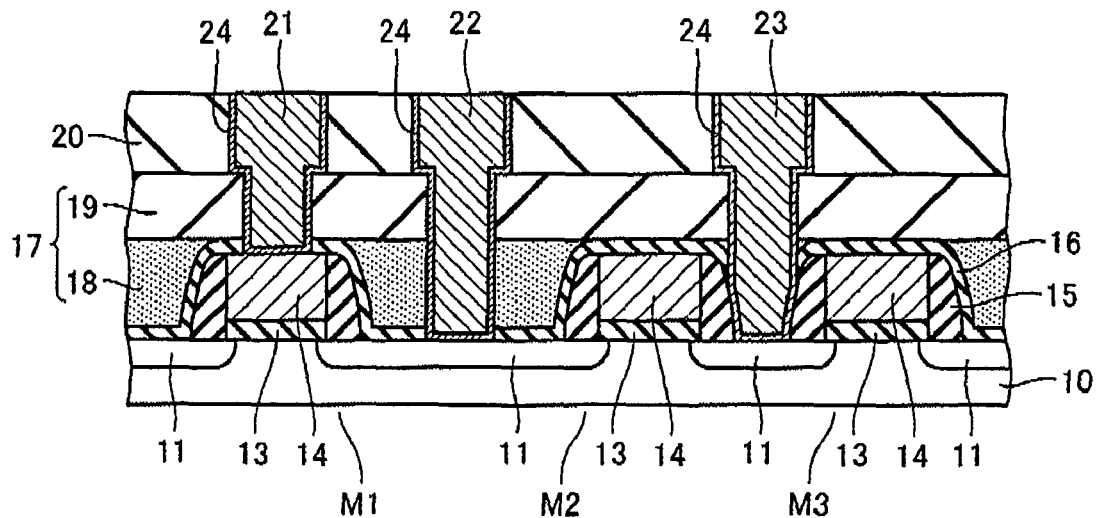
FIG. 8 is a cross-sectional view showing a structure of a semiconductor device according to a second embodiment of the present invention.

A second embodiment of the present invention is described next with reference to FIG. 8 and so forth using the same reference numerals to denote the same components as those in the first embodiment to omit the detailed description thereof. This embodiment differs from the first embodiment in that the interface between the first layered film 18 and the second layered film 19 of the interlayer insulator 17 is almost coincident with the upper surface of the silicon nitride film 16 on the gate electrode 14 as shown in FIG. 8. In other words, this second embodiment differs from the first embodiment in that on the gate electrode 14 only the second layered film 19 exists and the first layered film 18 does not exist.

Figure 9:
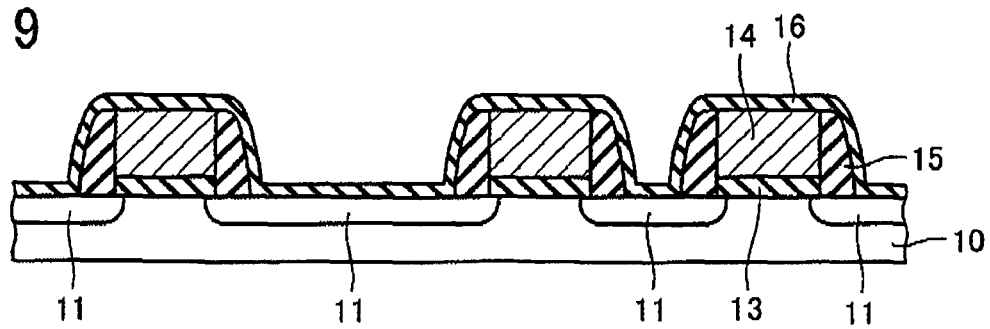
FIG. 9 shows a process step of the semiconductor device of the second embodiment.
Figure 10:
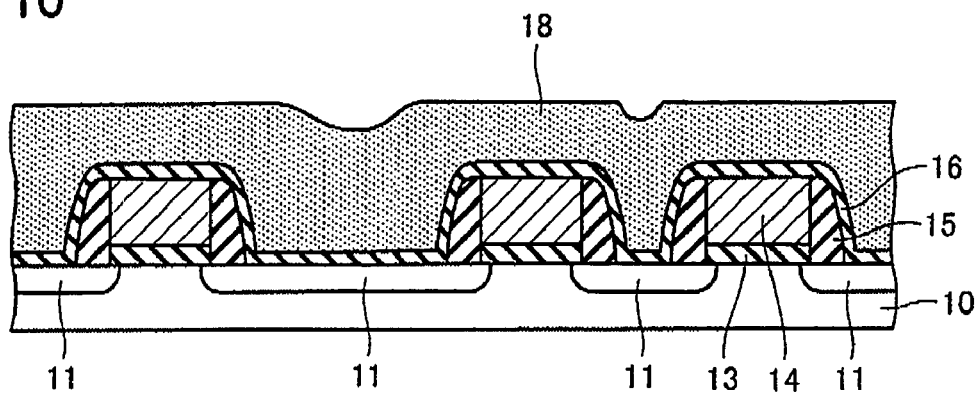
FIG. 10 shows a process step of the semiconductor device of the second embodiment.
Figure 11:
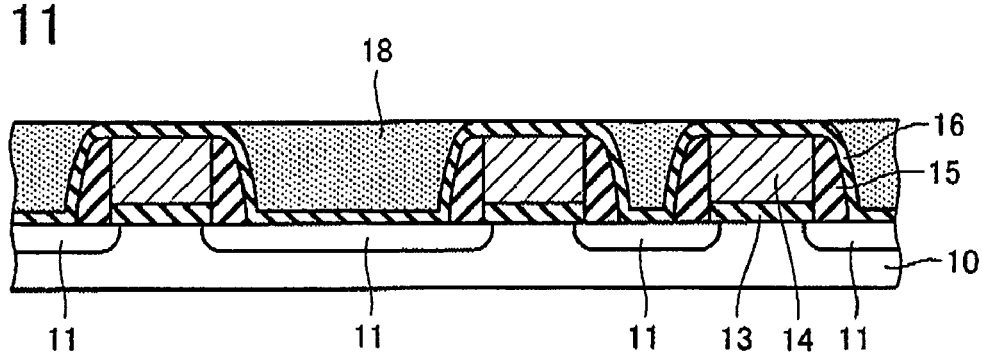
FIG. 11 shows a process step of the semiconductor device of the second embodiment.

Similar to the first embodiment, a MOS transistor is formed and the first layered film 18 is formed as shown in FIGS. 9 and 10. Then, the first layered film 18 is planarized by CMP using the resin slurry. At this time, however, as shown in FIG. 11, the silicon nitride film 16 on the gate electrode 14 is employed as a stopper film to execute CMP until the upper surface of the first layered film 18 coincides with the upper surface of the silicon nitride film 16. The slurried resin hardly reacts with silicon nitride. Therefore, execution of CMP hardly damages the surface of silicon nitride film 16.

Figure 12:
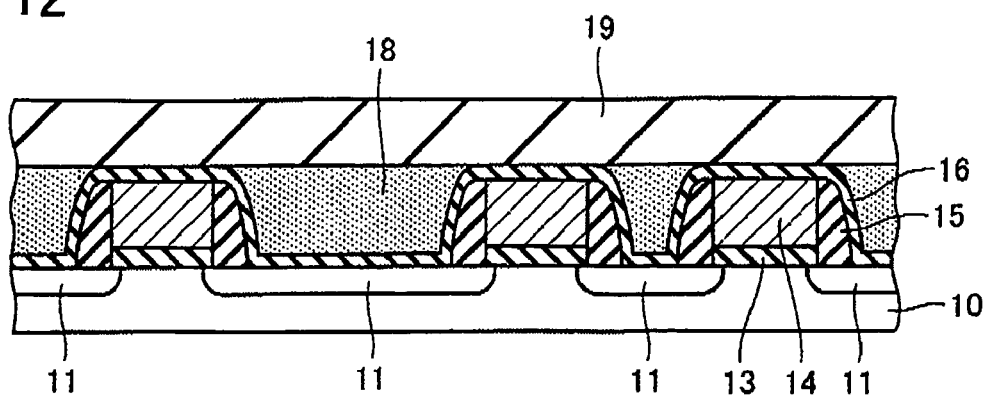
FIG. 12 shows a process step of the semiconductor device of the second embodiment.
Figure 13:
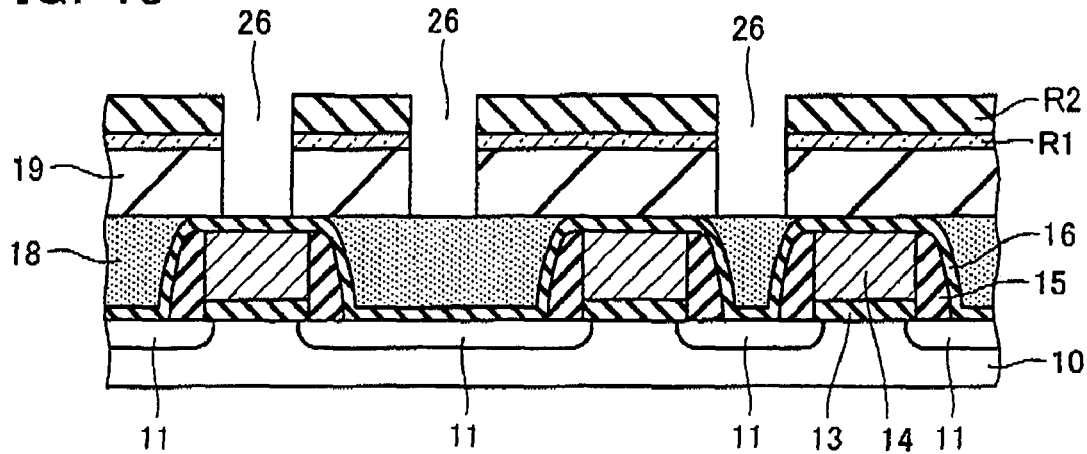
FIG. 13 shows a process step of the semiconductor device of the second embodiment.

After completion of this CMP, a TEOS film is deposited on the first layered film 18 by CVD or the like as shown in FIG. 12 to form the second layered film 19. Then, the antireflective film R1 and the resist R2 are formed on the second layered film 19 as shown in FIG. 13. Thereafter, the resist R2 is employed as a mask to form the contact holes 26 by RIE using a C4F8 gas. In this case, etching of the contact holes 26 on the gate electrode 14 stops at the upper surface of the silicon nitride film 16 because the selective ratio of the silicon nitride to the TEOS film is as high as about 5.

On the other hand, etching of the contact holes 26 on the source/drain-diffused region 11 stops at the interface between the first layered film 18 and the second layered film 19 because the selective ratio of the TEOS film to SiLK (trade name) is as high as 50 or more.

Figure 14:
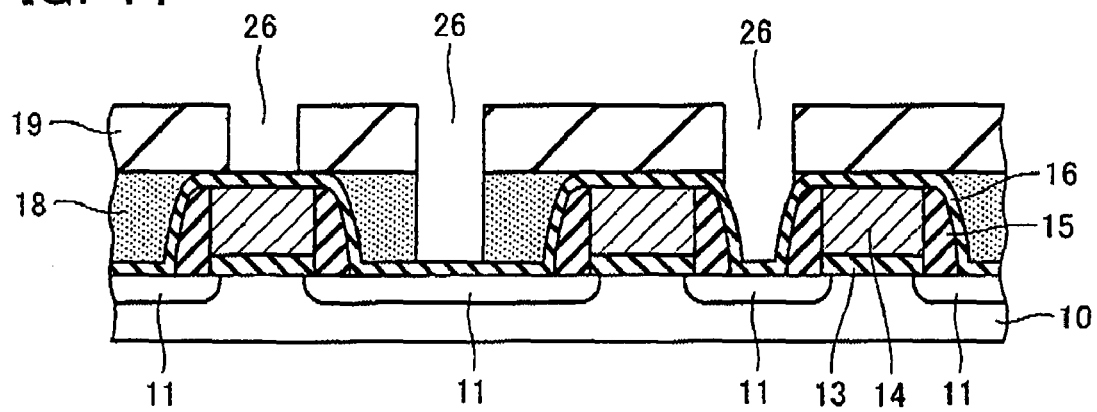
FIG. 14 shows a process step of the semiconductor device of the second embodiment.

Thereafter, the etching gas is switched to a NH3 gas to etch the first layered film 18 as shown in. FIG. 14. This etching stops at the silicon nitride film 16 because the selective ratio of SiLK (trade name) to silicon nitride is high. The location of the contact hole may deviate. In such the case, the silicon nitride film 16 and the sidewall insulating film 15 formed on the sides of the gate electrode 14 are not etched and only the first layered film 18 is etched. Therefore, the gate electrode 14 and others suffer no damage.

Finally, the etching gas is switched to a CF4 gas to remove the silicon nitride film 16 on the gate electrode 14 and the source/drain-diffused region 11 such that the contact holes 26 pass through them. Thereafter, the same steps as those in the first embodiment are executed to complete the semiconductor device shown in FIG. 8.

In the second embodiment, the interface between the first layered film 18 and the second layered film 19 is coincident with the upper surface of the silicon nitride film 16 on the gate electrode 14 and the first layered film 18 is not formed on the gate electrode 14. Accordingly, the shape of the contact hole on the gate electrode 14 can be approximated to an ideal tapered shape. In addition, the use of the silicon nitride film 16 as the stopper film in the process of CMP further improves the planarity of the interlayer insulator 17. An improvement in planarity facilitates a process of dual damascene when the process is applied to wiring in the upper layer.

Third Embodiment

Figure 15:
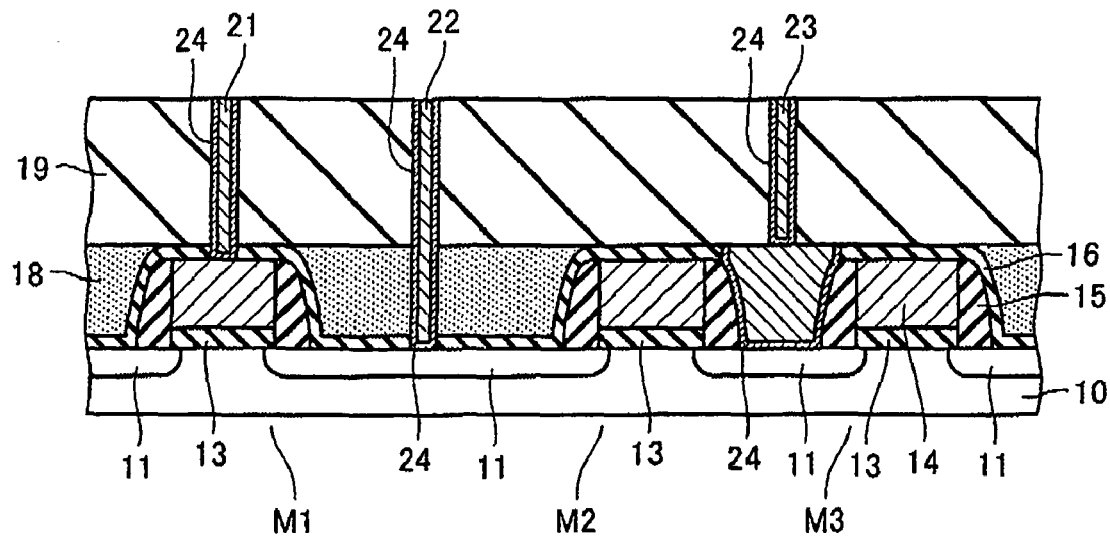
FIG. 15 is a cross-sectional view showing a structure of a semiconductor device according to a third embodiment of the present invention.

A third embodiment of the present invention is described next with reference to FIG. 15 and so forth using the same reference numerals to denote the same components as those in the above embodiments to omit the detailed description thereof. This embodiment differs in application of process steps from the above embodiments. Namely, a wide lower portion of the contact 23 is formed in the first layered film 18, then the second layered film 19 is formed, subsequently a narrow upper portion of the contact is formed in the second layered film 19.

Figure 16:
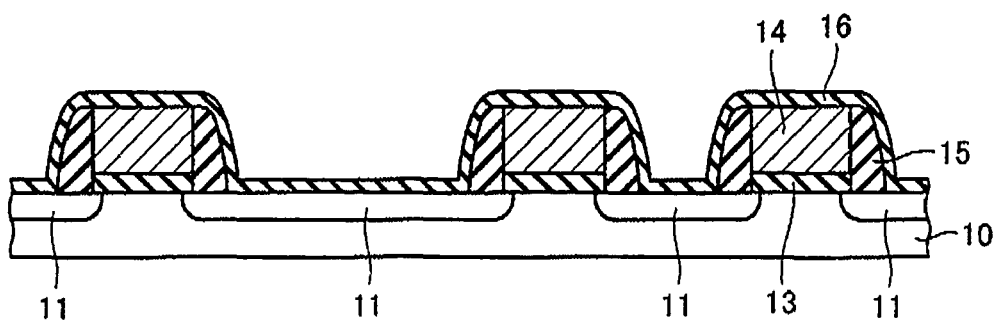
FIG. 16 shows a process step of the semiconductor device of the third embodiment.
Figure 17:
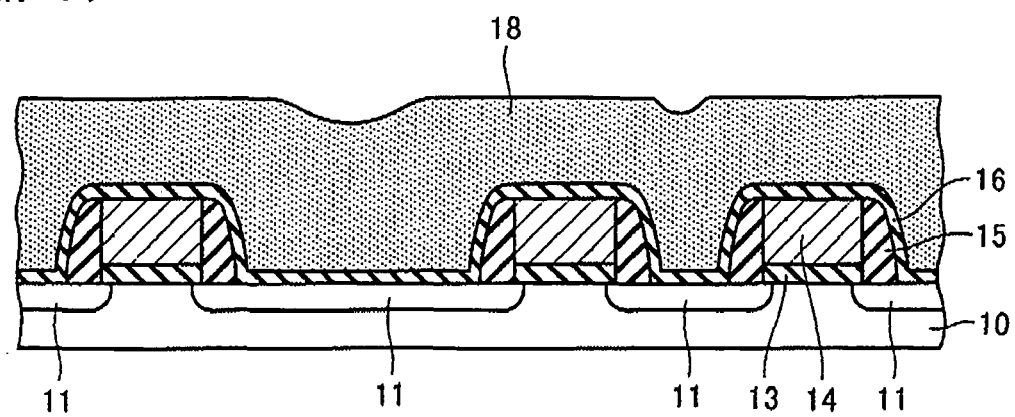
FIG. 17 shows a process step of the semiconductor device of the third embodiment.
Figure 18:
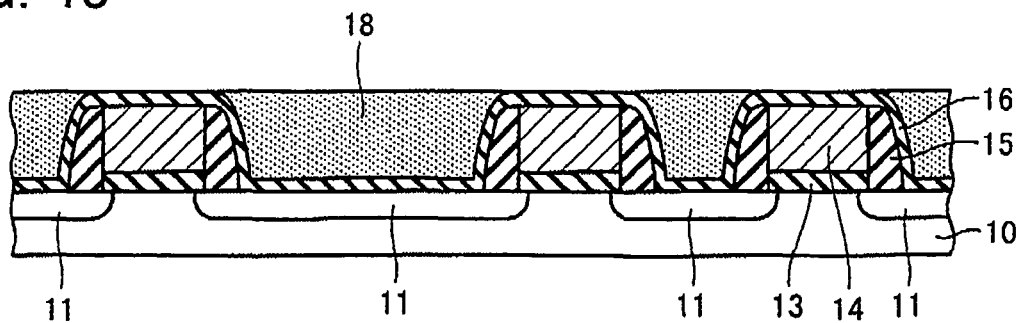
FIG. 18 shows a process step of the semiconductor device of the third embodiment.

A method of manufacturing the semiconductor device according to the third embodiment is described next with reference to FIGS. 16-21. Similar to the first embodiment, a MOS transistor is formed on the semiconductor substrate 10 (FIG. 16). Thereafter, the first layered film 18 is formed covering the MOS transistor (FIG. 17). Then, the resin is prepared as the slurry and the silicon nitride film 16 on the gate electrode 14 is employed as the stopper film. In this condition, the first layered film 18 is planarized by CMP such that the upper surface of the first layered film 18 coincides with the upper surface of the silicon nitride film 16 on the gate electrode 14 (FIG. 18).

Figure 19:
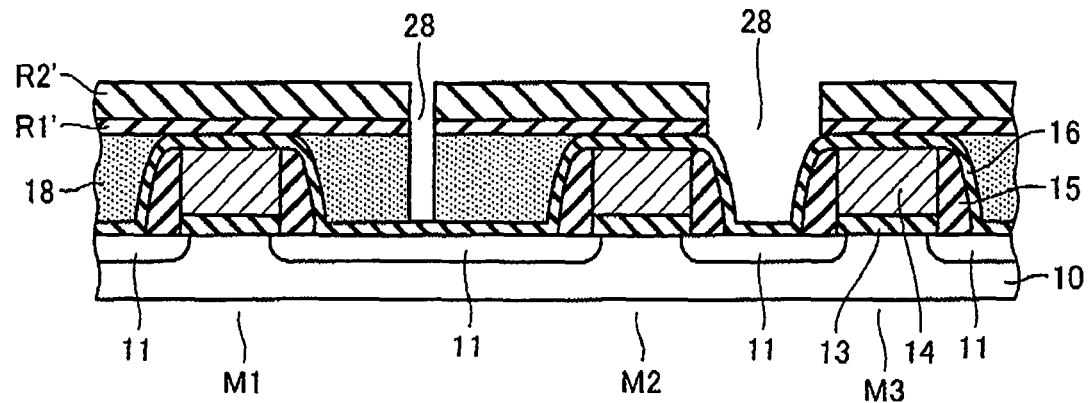
FIG. 19 shows a process step of the semiconductor device of the third embodiment.

Then, as shown in FIG. 19, an antireflective film R1' for resist is formed on the first layered film 18, and a resist R2' is patterned by photolithography. The resist R2' is employed as a mask to form contact hole patterns through the antireflective film R1' by RIE using a CF4 gas. Further, the pattern of the resist. R2' is employed as a mask to form contact holes 28 by RIE using a NH3 gas. The contact hole 28 reaching the source/drain-diffused region 11 is wider. In this case, as the NH3 gas is used, the silicon nitride film 16 is hardly etched and only the first layered film 18 can be etched along the contour of the silicon nitride film 16. Therefore, formation of wide contact holes does not damage the gate electrode 14 and others.

Figure 20:
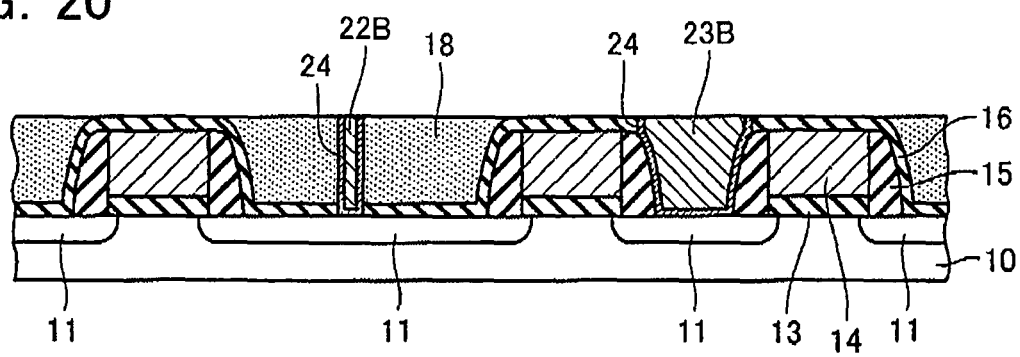
FIG. 20 shows a process step of the semiconductor device of the third embodiment.
Figure 21:
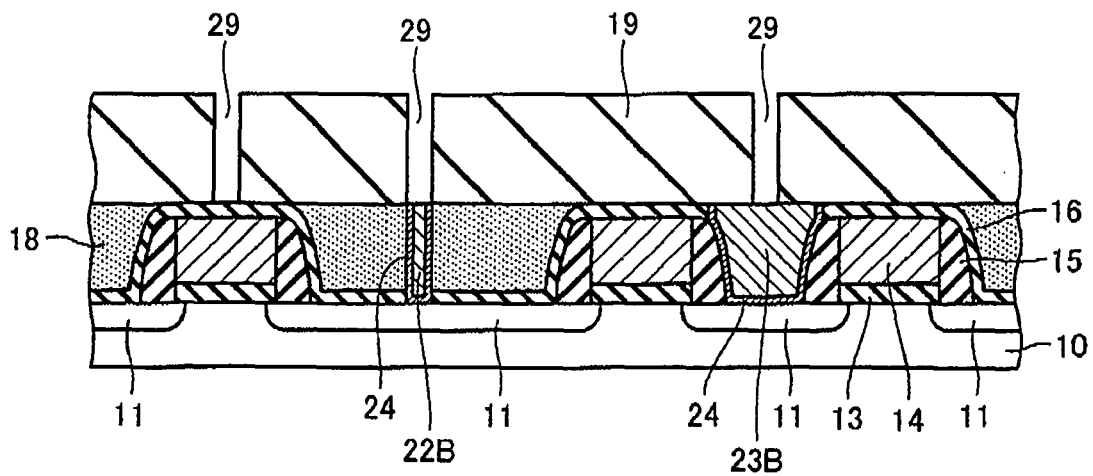
FIG. 21 shows a process step of the semiconductor device of the third embodiment.
Figure 22:
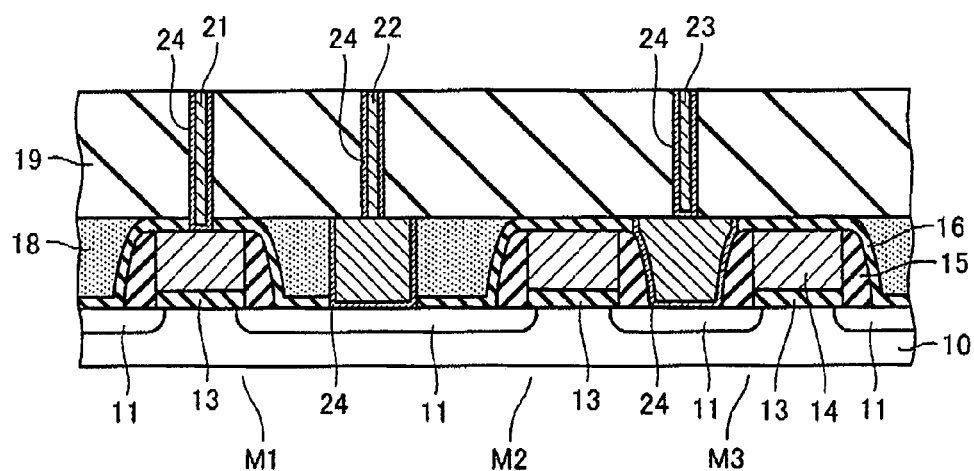
FIG. 22 shows a modification of the third embodiment.

Subsequently, after removal of the antireflective film R1', spattering is applied to form the barrier metal film 24 on the walls in the contact holes 28 as shown in FIG. 20. Then, a CVD process is used to deposit tungsten (W) in the contact holes 28 to form lower portions 22B, 23B of contacts. After removal of tungsten and so fourth outside the contact holes 28, a TEOS film is deposited on the first layered film 18 to form the second layered film 19 as shown in FIG. 21. Further, contact holes 29 are formed in the second layered film, and the barrier metal film 24 of tungsten is buried in the contact holes to form the contacts 21-23. In this case, the contact hole 28 formed wider provides a larger tolerance on the positional deviation with respect to the contact hole 29. The SION used in the resist R2' may disappear when the silicon nitride film 16 is etched finally or it can be removed when it is polished together by later CMP for removal prior to formation of the barrier metal film 24 and the lower portions 22B, 23B of the contacts. Not only the portion between the transistors M2 and M3 but also the lower portion of the contact 22 may be made wider as shown in FIG. 22.

The embodiments of the invention have been described above though the present invention is not limited to these embodiments but rather can be devised to provide various modification and additions without departing from the scope and spirit of the invention. For example, the above embodiments are directed to the examples in which the MOS transistor is formed on the semiconductor substrate though the present invention is not limited to the examples but is applicable to semiconductor devices including bipolar transistors formed therein. The conductive metal buried in the contact holes may include copper (Cu), aluminum (Al), tin (Sb), tantalum (Ta), titanium (Ti) and niobium (Nb) other than tungsten (W). As the material of the second layered film 19, various silicon-based insulating films such as silicon oxide can be employed in addition to TEOS as long as they have a higher selective ratio to the first layered film 18 and the silicon nitride film 16.

What is claimed is:

1. A semiconductor device, comprising:
   a semiconductor substrate having a first conductive layer and a second conductive layer formed thereon, said second conductive layer formed at a higher location than said first conductive layer;
   an insulating film formed over said first conductive layer and said second conductive layer;
   an interlayer insulator having a structure of at least two layers including a first layered film composed of an organic insulating material and a second layered film composed of an inorganic insulating material and formed on said first layered film, said interlayer insulator formed on said insulating film to cover said first conductive layer and said second conductive layer,
   wherein said first layered film has a height at an upper surface thereof coincident with a height of said insulating film;
   a first contact formed to penetrate the first layered film and the second layered film to reach the first conductive layer; and
   a second contact formed to penetrate the second layered film to reach the second conductive layer.

2. The semiconductor device according to claim 1, wherein said first layered film is planarized through a CMP process using a slurry of an organic material with a stopper film of said insulating film.

3. The semiconductor device according to claim 2, wherein said slurry comprises a resin.

4. The semiconductor device according to claim 2, wherein said insulating film is a silicon nitride film.

5. The semiconductor device according to claim 1, wherein said first conductive layer is an impurity-diffused region formed on said upper surface of said semiconductor substrate, and
   wherein said second conductive layer is a gate electrode of a MOS transistor formed on said semiconductor substrate with an insulating film interposed therebetween.

6. The semiconductor device according to claim 1, wherein said first layered film comprises a polyallylene-based organic film and said second layered film comprises a tetraethoxysilane film.

* * * * *